United States Patent
Hardy et al.

(10) Patent No.: US 9,594,144 B2
(45) Date of Patent: Mar. 14, 2017

(54) LOW-NOISE MAGNETIC RESONANCE IMAGING USING LOW HARMONIC PULSE SEQUENCES

(71) Applicant: General Electric Company, Schenectady, NY (US)

(72) Inventors: Christopher Judson Hardy, Schenectady, NY (US); Graeme Colin McKinnon, Hartland, WI (US)

(73) Assignee: General Electric Company, Niskayuna, NY (US)

( * ) Notice: Subject to any disclaimer, the term of this patent is extended or adjusted under 35 U.S.C. 154(b) by 511 days.

(21) Appl. No.: 14/260,069

(22) Filed: Apr. 23, 2014

(65) Prior Publication Data
US 2015/0309148 A1    Oct. 29, 2015

(51) Int. Cl.
| | | |
|---|---|---|
| *G01R 33/565* | (2006.01) | |
| *G01R 33/34* | (2006.01) | |
| *G01R 33/36* | (2006.01) | |
| *G01R 33/38* | (2006.01) | |
| *G01R 33/48* | (2006.01) | |
| *G01R 33/385* | (2006.01) | |
| G01R 33/561 | (2006.01) | |

(52) U.S. Cl.
CPC . *G01R 33/56572* (2013.01); *G01R 33/34092* (2013.01); *G01R 33/36* (2013.01); *G01R 33/3808* (2013.01); *G01R 33/4826* (2013.01); *G01R 33/3854* (2013.01); *G01R 33/5616* (2013.01); *G01R 33/5617* (2013.01)

(58) Field of Classification Search
CPC ........ G01R 33/56572; G01R 33/34092; G01R 33/36; G01R 33/3808; G01R 33/4826; G01R 33/3854; G01R 33/5616; G01R 33/5617

See application file for complete search history.

(56) References Cited

U.S. PATENT DOCUMENTS

| | | | |
|---|---|---|---|
| 4,509,015 A | 4/1985 | Ordidge et al. | |
| 4,695,799 A | 9/1987 | Hardy et al. | |
| 4,701,708 A | 10/1987 | Hardy et al. | |
| 4,727,325 A * | 2/1988 | Matsui | G01R 33/54 324/309 |
| 4,812,760 A | 3/1989 | Bottomley et al. | |
| 4,973,908 A | 11/1990 | Bottomley et al. | |
| 4,995,394 A | 2/1991 | Cline et al. | |
| 5,027,071 A | 6/1991 | Hardy et al. | |

(Continued)

FOREIGN PATENT DOCUMENTS

JP    2009-279238 A    12/2009

OTHER PUBLICATIONS

PCT Written Opinion dated Sep. 18, 2015 in relation to corresponding PCT Application PCT/US2015/026102.

(Continued)

*Primary Examiner* — Rodney Bonnette
(74) *Attorney, Agent, or Firm* — Melissa K. Dobson

(57) ABSTRACT

Systems and method for magnetic resonance imaging are disclosed which utilize sinusoidal gradient waveforms to drive gradient coils in an MRI system. The sinusoidal gradient waveforms may be applied on all two or more (e.g. three) gradient axes to produce a relatively pure acoustic tone. In certain embodiments, gradient directions may be spiraled in three-dimensions to generate a radial pin-cushion k-space trajectory.

21 Claims, 6 Drawing Sheets

(56) References Cited

U.S. PATENT DOCUMENTS

| | | |
|---|---|---|
| 5,133,357 A | 7/1992 | Dumoulin et al. |
| 5,192,909 A | 3/1993 | Hardy et al. |
| 5,201,311 A | 4/1993 | Bottomley et al. |
| 5,258,711 A | 11/1993 | Hardy et al. |
| 5,307,812 A | 5/1994 | Hardy et al. |
| 5,313,163 A | 5/1994 | Hardy et al. |
| 5,323,779 A | 6/1994 | Hardy et al. |
| 5,327,884 A | 7/1994 | Hardy et al. |
| 5,365,927 A | 11/1994 | Roemer et al. |
| 5,512,826 A | 4/1996 | Hardy et al. |
| 5,512,827 A | 4/1996 | Hardy et al. |
| 5,514,962 A | 5/1996 | Cline et al. |
| 5,521,507 A | 5/1996 | Rohan et al. |
| 5,548,216 A | 8/1996 | Dumoulin et al. |
| 5,578,924 A | 11/1996 | Dumoulin et al. |
| 5,584,293 A | 12/1996 | Darrow et al. |
| 5,711,300 A | 1/1998 | Schneider et al. |
| 5,999,839 A | 12/1999 | Hardy et al. |
| 6,008,648 A | 12/1999 | Linz et al. |
| 6,011,392 A * | 1/2000 | Zhou ............... G01R 33/56554 324/307 |
| 6,043,656 A | 3/2000 | Ma et al. |
| 6,043,659 A | 3/2000 | McKinnon |
| 6,070,095 A | 5/2000 | McKinnon et al. |
| 6,078,176 A | 6/2000 | McKinnon |
| 6,088,488 A | 7/2000 | Hardy et al. |
| 6,114,852 A | 9/2000 | Zhou et al. |
| 6,141,578 A | 10/2000 | Hardy et al. |
| 6,211,674 B1 | 4/2001 | Cline et al. |
| 6,239,597 B1 | 5/2001 | McKinnon |
| 6,249,120 B1 | 6/2001 | McKinnon et al. |
| 6,275,035 B1 | 8/2001 | Debbins et al. |
| 6,310,479 B1 | 10/2001 | Zhu et al. |
| 6,462,544 B1 | 10/2002 | McKinnon |
| 6,586,933 B1 | 7/2003 | Hardy et al. |
| 6,591,127 B1 | 7/2003 | McKinnon |
| 6,608,479 B1 | 8/2003 | Dixon et al. |
| 6,721,589 B1 | 4/2004 | Zhu et al. |
| 6,788,055 B2 | 9/2004 | McKinnon et al. |
| 6,833,700 B2 | 12/2004 | Lee et al. |
| 6,876,199 B2 | 4/2005 | Hardy et al. |
| 6,882,153 B2 | 4/2005 | Vavrek et al. |
| 6,925,319 B2 | 8/2005 | McKinnon |
| 6,980,846 B2 | 12/2005 | Hardy et al. |
| 6,982,552 B2 | 1/2006 | Hardy et al. |
| 7,009,395 B2 | 3/2006 | Dixon et al. |
| 7,106,062 B1 | 9/2006 | Hardy et al. |
| 7,135,864 B1 | 11/2006 | McKinnon et al. |
| 7,161,511 B2 | 1/2007 | Koste et al. |
| 7,167,000 B2 | 1/2007 | Amm et al. |
| 7,209,777 B2 | 4/2007 | Saranathan et al. |
| 7,279,893 B1 | 10/2007 | Marinelli et al. |
| 7,282,915 B2 | 10/2007 | Giaquinto et al. |
| 7,307,419 B2 | 12/2007 | Zhu et al. |
| 7,365,542 B1 | 4/2008 | Hardy et al. |
| 7,498,813 B2 | 3/2009 | Giaquinto et al. |
| 7,525,313 B2 | 4/2009 | Boskamp et al. |
| 7,612,564 B1 | 11/2009 | Hardy et al. |
| 7,746,074 B2 | 6/2010 | Bulumulla et al. |
| 7,782,058 B2 | 8/2010 | Hardy et al. |
| 7,809,423 B2 | 10/2010 | Hardy et al. |
| 7,977,943 B2 | 7/2011 | Marinelli et al. |
| 7,994,788 B2 | 8/2011 | Hardy et al. |
| 8,063,637 B2 | 11/2011 | Xu et al. |
| 8,102,177 B2 | 1/2012 | McKinnon |
| 8,143,893 B2 | 3/2012 | McKinnon |
| 8,160,342 B2 | 4/2012 | Khare et al. |
| 8,165,377 B2 | 4/2012 | Vaidya et al. |
| 8,217,651 B2 | 7/2012 | Wiesinger et al. |
| 8,274,286 B2 | 9/2012 | Koch et al. |
| 8,380,284 B2 | 2/2013 | Saranathan et al. |
| 8,559,688 B2 | 10/2013 | Khare et al. |
| 8,700,125 B2 | 4/2014 | Saranathan et al. |
| 2004/0204643 A1 | 10/2004 | Jesmanowicz |
| 2006/0074291 A1 | 4/2006 | Hardy et al. |
| 2006/0132132 A1 | 6/2006 | Zhu et al. |
| 2006/0173268 A1 | 8/2006 | Mullick et al. |
| 2007/0236217 A1 | 10/2007 | Porter |
| 2010/0141253 A1* | 6/2010 | Takizawa ........... G01R 33/4824 324/309 |
| 2011/0038560 A1 | 2/2011 | Khare et al. |
| 2012/0146646 A1 | 6/2012 | Manipatruni et al. |
| 2012/0161767 A1 | 6/2012 | Hardy et al. |
| 2012/0161768 A1 | 6/2012 | Hardy et al. |
| 2012/0169341 A1 | 7/2012 | McKinnon |
| 2012/0249136 A1 | 10/2012 | Marinelli et al. |
| 2013/0271130 A1 | 10/2013 | Tan et al. |
| 2013/0281822 A1 | 10/2013 | Graziani et al. |
| 2013/0320981 A1 | 12/2013 | Bulumulla et al. |
| 2013/0320982 A1 | 12/2013 | Bulumulla et al. |
| 2014/0005520 A1 | 1/2014 | Foo et al. |
| 2014/0079304 A1 | 3/2014 | Foo et al. |
| 2014/0091791 A1 | 4/2014 | Bulumulla et al. |

OTHER PUBLICATIONS

Hennel, F., et al.; "Silent MRI With Soft Gradient Pulses"; Magnetic Resonance to Medicine 42, pp. 6-10 (1999).

Hennel, Franciszek, Ph.D., "Fast Spin Echo and Fast Gradient Echo MRI With Low Acoustic Noise"; Journal of Magnetic Resonance Imaging 13, pp. 960-966 (2001).

* cited by examiner

LOW-NOISE MAGNETIC RESONANCE IMAGING USING LOW HARMONIC PULSE SEQUENCES

BACKGROUND

In general, magnetic resonance imaging (MRI) examinations are based on the interactions among a primary magnetic field, a radiofrequency (RF) magnetic field, and time varying magnetic gradient fields with a gyromagnetic material having nuclear spins within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

The magnetic fields used to generate images in MRI systems include a highly uniform, static magnetic field that is produced by a primary magnet. A series of gradient fields are produced by a set of gradient coils located around the imaging volume in which the subject is placed. The gradient fields encode positions of individual plane or volume elements (pixels or voxels) in two or three dimensions. An RF coil is employed to produce an RF magnetic field. This RF magnetic field perturbs the spins of some of the gyromagnetic nuclei from their equilibrium directions, causing the spins to precess around the axis of their equilibrium magnetization. During this precession, RF fields are emitted by the spinning, precessing nuclei and are detected by either the same transmitting RF coil, or by one or more separate coils. These signals are amplified, filtered, and digitized. The digitized signals are then processed using one or more algorithms to reconstruct a useful image.

In practice, driving the gradient coils may result in substantial amounts of acoustic noise due to the waveforms employed and the manner in which these waveform interact acoustically. One current approach for low-noise MRI may utilize very low tip angle excitation pulses, which results in inherent proton-density contrast and which constrains the use of other types of available contrast. To address these issues, some approaches employ spin-preparation sequences to expand the range of available contrast, but such approaches involve added complexity and scan duration. Thus, there is a need for low-noise MRI approaches that do not suffer from the same constraints.

BRIEF DESCRIPTION

In one embodiment, a method is provided for driving gradient coils of a magnetic resonance imaging system. The method includes the step of driving at least a first gradient coil associated with a first gradient direction using a first sinusoidal gradient waveform and a second gradient coil associated with a second gradient direction using a second sinusoidal gradient waveform. RF pulses are generated at one or more crossover events when the first sinusoidal gradient waveform and the second sinusoidal gradient waveform cross their respective gradient zero lines. A respective readout signal is acquired after each RF pulse. An image is generated using the acquired readout signals.

In a further embodiment, one or more tangible, non-transitory machine-readable media are provided that encode processor-executable routines. The routines, when executed by a processor cause acts to be performed comprising: driving at least a first gradient coil associated with a first gradient direction using a first sinusoidal gradient waveform and a second gradient coil associated with a second gradient direction using a second sinusoidal gradient waveform; generating RF pulses at one or more crossover events when the first sinusoidal gradient waveform and the second sinusoidal gradient waveform cross their respective gradient zero lines; acquiring a respective readout signal after each RF pulse; and generating an image using the acquired readout signals.

In an additional embodiment, a magnetic resonance imaging (MRI) system is provided. The MRI system includes a primary field magnet, a plurality of gradient field coils, a radiofrequency (RF) transmit coil, an array of receiving coils, and control circuitry coupled to the gradient field coils, to the RF transmit coil, and to the array of receiving coils. The control circuitry is configured to: drive at least a first gradient coil associated with a first gradient direction using a first sinusoidal gradient waveform and a second gradient coil associated with a second gradient direction using a second sinusoidal gradient waveform; generate RF pulses at one or more crossover events when the first sinusoidal gradient waveform and the second sinusoidal gradient waveform cross their respective gradient zero lines; acquire a respective readout signal after each RF pulse; and generate an image using the acquired readout signals.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
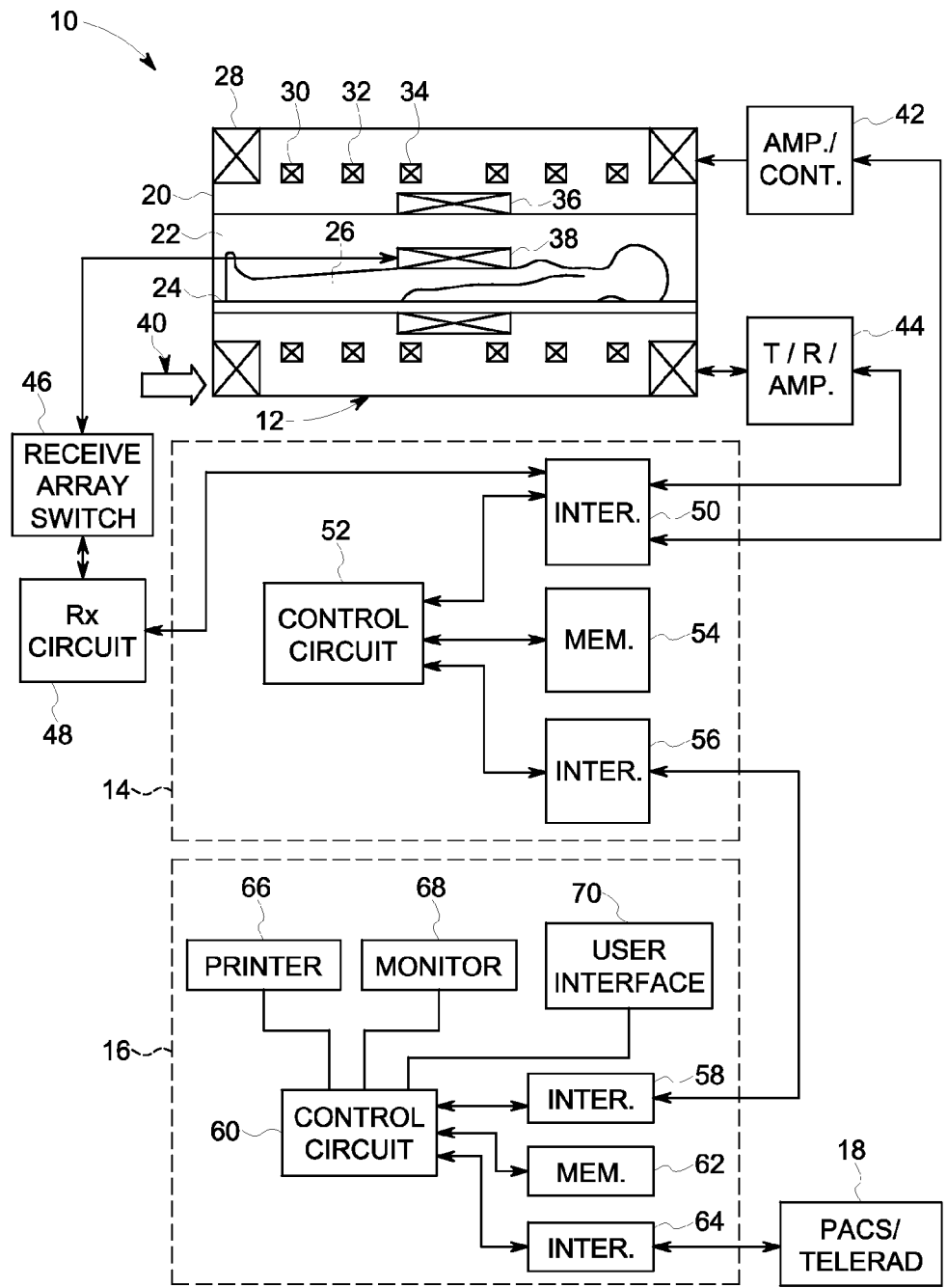
FIG. 1 is a diagrammatical illustration of an embodiment of a magnetic resonance (MR) imaging system configured to acquire MR images and perform the image correction techniques described herein, in accordance with an aspect of the present disclosure.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

As noted above, current MRI approaches may result in a relatively noisy environment, with driving of the gradient coils in particular resulting in acoustic noise. As discussed herein, various approaches are disclosed that utilize gradient waveforms that are pure (or substantially pure) tone (e.g., sine waves or alternating-polarity long-ramped trapezoids approximating sine waves) on at least two or all three gradient axes. When employed with a repetition time (TR) (i.e., the time interval between successive RF pulses) greater than a specified threshold, which may vary depending on the pulse sequence employed, the resulting fundamental frequency may be essentially inaudible relative to the ambient noise (e.g., below 60 Hz). By way of example, for certain contemplated gradient-echo (GRE) pulse sequences employing vertically offset gradient waveforms, frequencies between 10 Hz to 60 Hz correspond to TRs of between 100 ms to 16.7 ms, respectively. In other examples, for certain contemplated gradient-echo (GRE) pulse sequences where gradient waveforms are not offset, frequencies between 10 Hz to 60 Hz correspond to TRs of between 50 ms to 8.3 ms. In further examples, for certain contemplated multi-echo gradient-echo (GRE) pulse sequences where gradient waveforms are not offset, frequencies between 10 Hz to 60 Hz correspond to TRs of between 200 ms to 33.3 ms, respectively.

With respect to imaging, RF excitation pulses, in certain embodiments, may be applied at zero crossings of the gradients (such as at every zero crossing or at alternating zero crossings), allowing larger tip angles (potentially up to 90°) to be applied that are possible in current low-noise approaches. Signals may be sampled immediately following RF pulses in other embodiments, during alternating gradient lobes. In one embodiment, the gradient directions are spiraled in three-dimensions (3D), resulting in a radial pincushion k-space trajectory. When employed, such spiraling introduces only limited harmonics.

With the preceding in mind, the presently described approaches may be performed by a magnetic resonance imaging (MRI) system on which specific imaging routines are initiated by a user (e.g., a radiologist). The MRI system may perform data acquisition, data construction, image reconstruction/synthesis, and image processing. Accordingly, referring to FIG. 1, an example of a suitable magnetic resonance imaging system 10 is illustrated schematically as including a scanner 12, a scanner control circuit 14, and a system control circuitry 16. System 10 additionally includes remote access and storage systems or devices as picture archiving and communication systems (PACS) 18, or other devices such as teleradiology equipment so that data acquired by the system 10 may be accessed on- or off-site. While the MRI system 10 may include any suitable scanner or detector, in the illustrated embodiment, the system 10 includes a full body scanner 12 having a housing 20 through which a bore 22 is formed. A table 24 is movable into the bore 22 to permit a patient 26 to be positioned therein for imaging selected anatomy within the patient 26. The selected anatomy may be imaged by a combination of patient positioning, selected excitation of certain gyromagnetic nuclei within the patient 26, and by using certain features for receiving data from the excited nuclei as they spin and precess, as described below.

Scanner 12 includes a series of associated coils for producing controlled magnetic fields for exciting the gyromagnetic material within the anatomy of the subject being imaged. Specifically, a primary magnet coil 28 is provided for generating a primary magnetic field generally aligned with the bore 22. A series of gradient coils 30, 32, and 34 permit controlled magnetic gradient fields to be generated for positional encoding of certain of the gyromagnetic nuclei within the patient 26 during examination sequences. A radio frequency (RF) coil 36 is provided, and is configured to generate radio frequency pulses for exciting the certain gyromagnetic nuclei within the patient.

In addition to the coils that may be local to the scanner 12, the system 10 also includes a separate set of receiving coils 38 (e.g., a phased array of coils) configured for placement proximal (e.g., against) the patient 26. The receiving coils 38 may have any geometry, including both enclosed and single-sided geometries. As an example, the receiving coils 38 can include cervical/thoracic/lumbar (CTL) coils, head coils, single-sided spine coils, and so forth. Generally, the receiving coils 38 are placed close to or on top of the patient 26 so as to receive the weak RF signals (weak relative to the transmitted pulses generated by the scanner coils) that are generated by certain of the gyromagnetic nuclei within the patient 26 as they return to their relaxed state. The receiving coils 38 may be switched off so as not to receive or resonate with the transmit pulses generated by the scanner coils, and may be switched on so as to receive or resonate with the RF signals generated by the relaxing gyromagnetic nuclei.

The various coils of system 10 are controlled by external circuitry to generate the desired field and pulses, and to read emissions from the gyromagnetic material in a controlled manner. In the illustrated embodiment, a main power supply 40 provides power to the primary field coil 28. A driver circuit 42 is provided for pulsing the gradient field coils 30, 32, and 34, such as using the waveforms and pulse sequences as discussed herein. Such a circuit may include amplification and control circuitry for supplying current to the coils as defined by digitized pulse sequences output by the scanner control circuit 14. Another control circuit 44 is provided for regulating operation of the RF coil 36. Circuit 44 includes a switching device for alternating between the active and inactive modes of operation, wherein the RF coil 36 transmits and does not transmit signals, respectively. Circuit 44 also includes amplification circuitry for generating the RF pulses. Similarly, the receiving coils 38 are connected to switch 46 that is capable of switching the receiving coils 38 between receiving and non-receiving modes such that the receiving coils 38 resonate with the RF signals produced by relaxing gyromagnetic nuclei from within the patient 26 while in the receiving state, and they do not resonate with RF energy from the transmitting coils (i.e., coil 36) so as to prevent undesirable operation while in the non-receiving state. Additionally, a receiving circuit 48 is provided for receiving the data detected by the receiving coils 38, and may include one or more multiplexing and/or amplification circuits.

Scanner control circuit 14 includes an interface circuit 50 for outputting signals for driving the gradient field coils 30, 32, 34 and the RF coil 36. Additionally, interface circuit 50 receives the data representative of the magnetic resonance signals produced in examination sequences from the receiving circuitry 48 and/or the receiving coils 38. The interface circuit 50 is operatively connected to a control circuit 52. The control circuit 52 executes the commands for driving the circuit 42 and circuit 44 based on defined protocols selected via system control circuit 16. Control circuit 52 also serves to provide timing signals to the switch 46 so as to synchronize the transmission and reception of RF energy. Further, control circuit 52 receives the magnetic resonance signals and may perform subsequent processing before transmitting the data to system control circuit 16. Scanner control circuit 14 also includes one or more memory circuits 54, which store configuration parameters, pulse sequence descriptions, examination results, and so forth, during operation. The memory circuits 54, in certain embodiments, may store instructions for implementing at least a portion of the image processing techniques described herein.

Interface circuit 56 is coupled to the control circuit 52 for exchanging data between scanner control circuit 14 and system control circuit 16. Such data may include selection of specific examination sequences to be performed, configuration parameters of these sequences, and acquired data, which may be transmitted in raw or processed form from scanner control circuit 14 for subsequent processing, storage, transmission and display.

An interface circuit 58 of the system control circuit 16 receives data from the scanner control circuit 14 and transmits data and commands back to the scanner control circuit 14. The interface circuit 58 is coupled to a control circuit 60, which may include one or more processing circuits in a multi-purpose or application specific computer or workstation. Control circuit 60 is coupled to a memory circuit 62, which stores programming code for operation of the MRI system 10 and, in some configurations, the image data for later reconstruction, display and transmission. An additional interface circuit 64 may be provided for exchanging image data, configuration parameters, and so forth with external system components such as remote access and storage devices 18. Finally, the system control circuit 60 may include various peripheral devices for facilitating operator interface and for producing hard copies of the reconstructed images. In the illustrated embodiment, these peripherals include a printer 66, a monitor 68, and user interface 70 including devices such as a keyboard or a mouse.

It should be noted that subsequent to the acquisitions described herein, the system 10 may simply store the acquired data for later access locally and/or remotely, for example in a memory circuit (e.g., memory 56, 62). Thus, when accessed locally and/or remotely, the acquired data may be manipulated by one or more processors contained within an application-specific or general-purpose computer. The one or more processors may access the acquired data and execute routines stored on one or more non-transitory, machine readable media collectively storing instructions for performing methods including the image acquisition, processing, and/or reconstruction steps described herein.

As discussed herein, the present approaches include the use of pulse sequences based on sinusoidal gradient waveforms for driving the gradient coils 30, 32, 34 to produce a relatively pure acoustic tone. If employed with a repetition time (TR) greater than a given threshold, which may vary depending on the pulse sequence in question, the associated fundamental frequency is approximately 10 Hz to 60 Hz or lower, which is substantially inaudible in an image acquisition context.

Figure 2A:
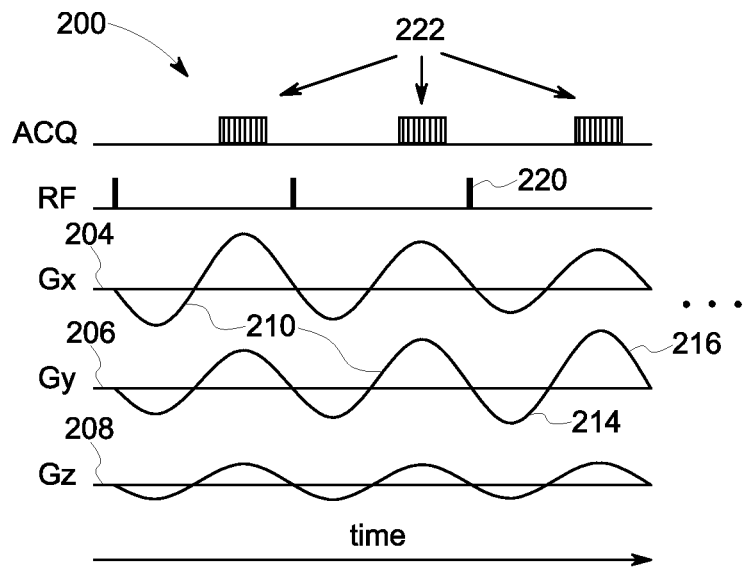
FIG. 2A depicts an embodiment of a pulse sequence diagram employing offset sinusoidal gradient waveforms, in accordance with an aspect of the present disclosure.
Figure 2B:
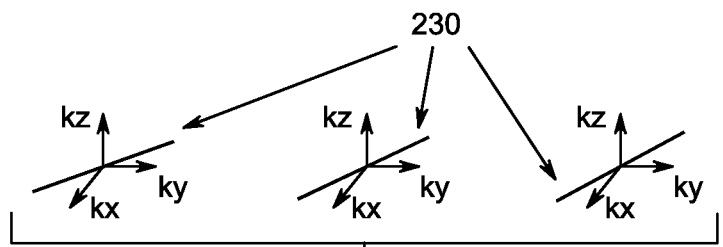
FIG. 2B depicts axial k-space components for the pulse sequence diagram of FIG. 2A, in accordance with an aspect of the present disclosure.
Figure 2C:
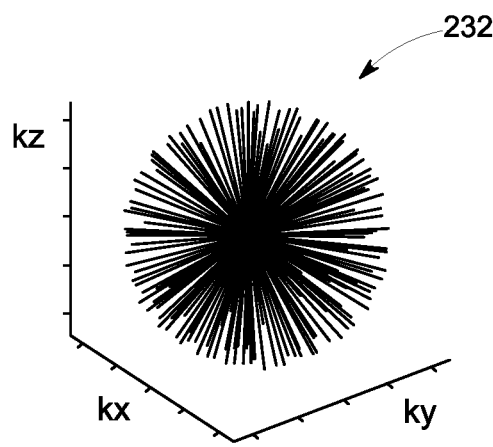
FIG. 2C depicts an example of a radial k-space trajectory for the pulse sequence diagram of FIG. 2A, in accordance with an aspect of the present disclosure.

Turning to FIGS. 2A-2C, a portion of an embodiment of a quiet gradient-echo (GRE) pulse sequence 200 is depicted that utilizes sinusoidal waveforms 210 to drive the gradient coils 30, 32, and 34 over time. In certain implementations of the pulse sequence 200, a frequency of 10 Hz corresponds to a TR of 100 ms, a frequency of 60 Hz corresponds to a TR of 16.7 ms, and so forth (i.e., the inverse of the frequency corresponds to the TR in milliseconds. As shown in FIG. 2A substantially sinusoidal waveforms 210 are played out on each gradient axis (i.e., Gx (204), Gy (206), and Gz (208)). As will be appreciated, in other embodiments, the sinusoidal waves 210 may be approximated using alternating-polarity long-ramped trapezoids.

In the depicted example, the respective sinusoids 210 are offset vertically relative to the respective gradient axes such that the portions (i.e., lobes) above and below the zero line are not equal. By way of example, for a given gradient and sinusoidal pulse sequence, the positive lobes may be twice (or some other suitable fraction) the area of the corresponding negative lobes or vice versa. In the depicted implementation, vertical offsetting of the gradient waveforms 210, as shown, should result in negligible increase in sound levels. In particular, this is believed to be the case because the Fourier transform is linear for two functions A(t) and B(t). Therefore, FFT(A+B)=FFT(A)+FFT(B). In the present context, the function A(t) is the repeating sinusoidal waveform 210 and B(t) is a constant. Since FFT(B) is a delta function at zero frequency, this will not make a significant contribution to sound levels, which should remain the same as for non-offset sinusoidal waves.

In certain embodiments, the sinusoidal waves may be approximated using trapezoids of alternating polarity. In such embodiments, if the ramps of the trapezoids are sufficiently long (e.g., approximately half as long as the corresponding trapezoid flat top), the trapezoids may provide a reasonable approximation of a sinusoidal wave and may, therefore, introduce only limited harmonics. In such embodiments, sampling on the ramps may be employed for each data readout, but a radial reconstruction may still be used.

In the depicted example, non-selective RF pulses 220 are applied at the gradient zero crossings prior to each first lobe (e.g., prior to the beginning of each negative lobe 214). In the depicted example, signals are sampled during readout periods 222, here depicted as being centered about the peak of the second lobe of a given cycle (e.g., the positive lobes 216). In such an implementation, the negative lobes 214 can be considered readout prephasers, and each echo will be centered on a positive lobe peak, resulting in some degree of T2* contrast.

Each readout interval 222 corresponds to traversal of the corresponding line 230 (FIG. 2B) through the center of k-space. Each cycle of the gradient sinusoids 210 has a different relative amplitude among the gradients Gx, Gy, and Gz, producing a different orientation of corresponding line 230 for each cycle. The resulting sampling 232 (FIG. 2C) of k-space consists of radial lines in three dimensions, all passing substantially through the origin of k-space. Because data sampling (i.e., readouts 222) occurs during a non-constant gradient, the sampling interval along each line 230 of k-space is non-uniform. Three-dimensional image reconstruction can be performed on the data using conventional gridding techniques.

Figure 3A:
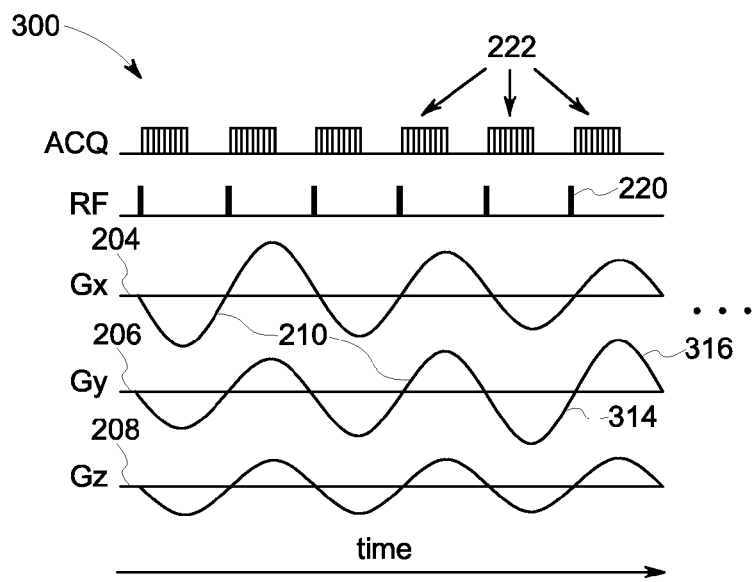
FIG. 3A depicts an embodiment of a pulse sequence diagram employing sinusoidal gradient waveforms, in accordance with an aspect of the present disclosure.
Figure 3B:
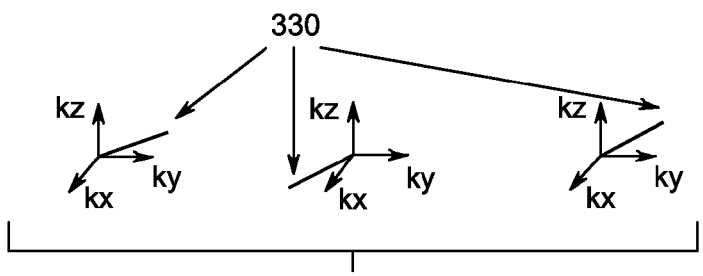
FIG. 3B depicts axial k-space components for the pulse sequence diagram of FIG. 3A, in accordance with an aspect of the present disclosure.
Figure 3C:
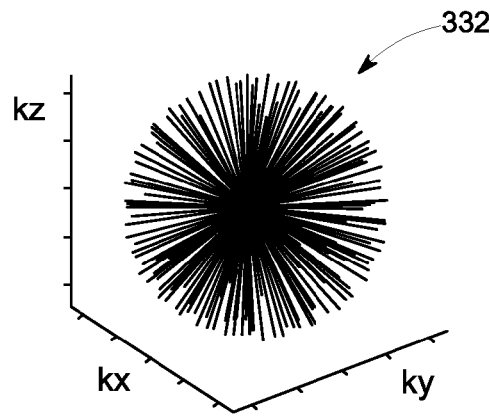
FIG. 3C depicts an example of a radial k-space trajectory for the pulse sequence diagram of FIG. 3A, in accordance with an aspect of the present disclosure.

Turning to FIGS. 3A-3C, a detail of another embodiment of a quiet GRE pulse sequence 300 is depicted in which the gradient coils 30, 32, 34 are driven using sinusoidal waveforms 210. In this example, RF excitation pulses 220 are applied at each zero crossing of the sinusoidal waveforms 210 with respect to the gradient axes (i.e., Gx line 204, Gy line 206, and Gz line 208). In certain implementations of the pulse sequence 300, a frequency of 10 Hz corresponds to a TR of 50 ms, a frequency of 60 Hz corresponds to a TR of 8.3 ms, and so forth (i.e., half of the inverse of the frequency corresponds to the TR in milliseconds. In one implementation, larger tip angles (up to 90°) may be applied relative to prior approaches. Unlike the preceding example, in the depicted implementation the area under the first (i.e., negative) gradient lobe 314 of each sinusoidal cycle is the negative of the area under the respective second (i.e., positive) gradient lobe 316.

Readout, in this example, is performed following each RF pulse 220 during readout intervals 222, resulting in nonlinear sampling of k-space. Each readout 222 corresponds to traversal of corresponding line 330 (FIG. 3B) that starts substantially at the center of k-space and radiates outward. Each cycle of the gradient sinusoids 210 has a different relative amplitude among the gradients Gx, Gy, and Gz, producing a different orientation of corresponding line 330. The resulting sampling 332 (FIG. 3C) of k-space consists of radial lines in three dimensions, all originating substantially at the origin of k-space. Because data sampling 222 occurs during a non-constant gradient, the sampling interval along each line 330 of k-space is non-uniform. Three-dimensional image reconstruction can be performed on the data using conventional gridding techniques. In this embodiment, short T2* signals are captured, and can be considered an ultrashort echo time (UTE) sequence.

Figure 4:
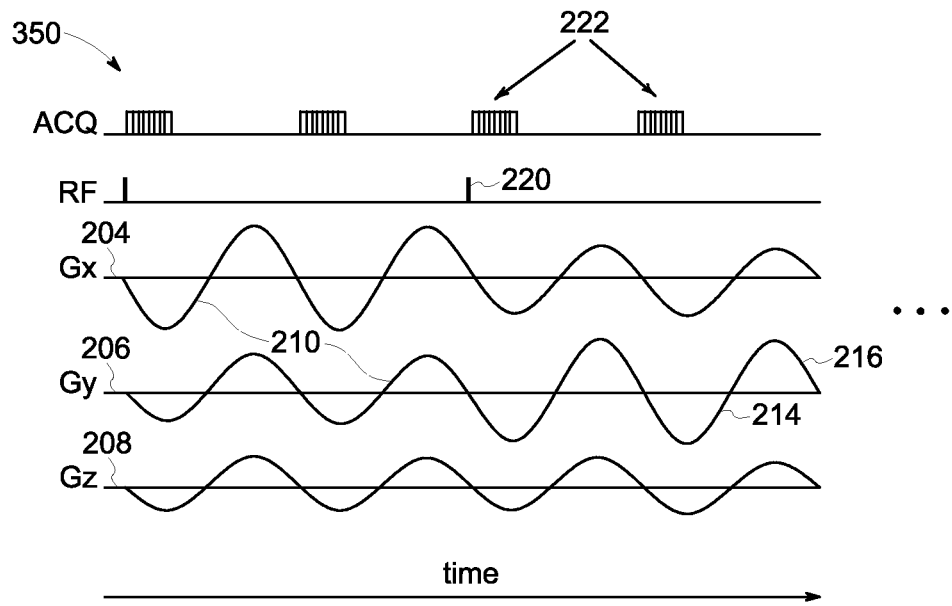
FIG. 4 depicts a further embodiment of a pulse sequence diagram employing sinusoidal gradient waveforms, in accordance with an aspect of the present disclosure.

Turning to FIG. 4, a further implementation of a multiple-echo version of the pulse sequence of FIG. 3A may be employed. An example of such an implementation is illustrated in FIG. 4, which depicts a detail of a multiple-echo version of a quiet GRE pulse sequence 350 used to drive the gradient coils 30, 32, 34 using sinusoidal waveforms 210. In certain implementations of the pulse sequence 350, a frequency of 10 Hz corresponds to a TR of 200 ms, a frequency of 60 Hz corresponds to a TR of 33.3 ms, and so forth (i.e., twice the inverse of the frequency corresponds to the TR in milliseconds. In such an embodiment, an RF excitation pulse 220 is only applied every n-periods (e.g., every 2 periods, every 3 periods, and so forth), with n sets of data (e.g., 2 sets, 3 sets, and so forth) being acquired (as shown by readout intervals 222) for each RF excitation pulse 220. In one such embodiment, a separate image is reconstructed using each set of acquired data.

In this example, each set of data is acquired at a different echo time. The multiple echo time data sets may be used for various applications. For example, the multiple echo time data sets may be used for qualitative imaging by fitting a time curve through each pixel, allowing an estimate of T2* to be obtained. In addition, the multiple echo time data sets may be used for highlighting certain anatomical features, such as tendons, menisci, cartilage, and so forth. For example, in an implementation where n=2, subtracting the second echo-time image from the first echo-time image would produce an image which highlights the rapidly decaying T2* tissues (the short T2* tissues) which tend to be the more solid-like tissues mentioned prior.

Figure 5:
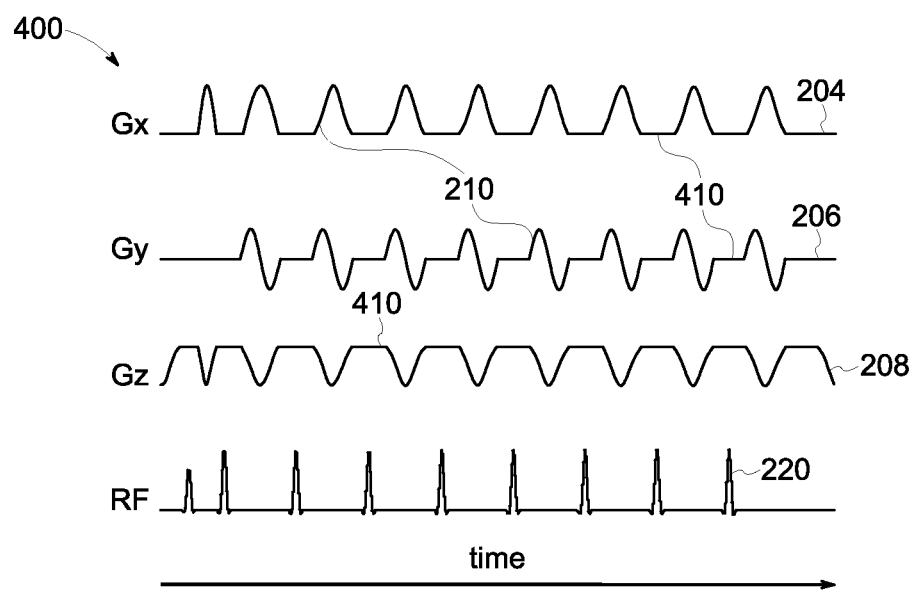
FIG. 5 depicts an embodiment of a pulse sequence diagram employing discontinuous sinusoidal gradient waveforms, in accordance with an aspect of the present disclosure.

Turning to FIG. 5, a detail of an example of a suitable quiet fast-spin-echo pulse sequence 400 is depicted. In the depicted example, discontinuous sinusoidal waveforms 210 are employed for driving the gradient coils 30, 32, 34. In this example, a full-cycle sinusoidal waveform, intermittent with a disruption or discontinuity, is provided as part of the pulse sequence 400 for each gradient coil. For example, in one embodiment, each sinusoidal wave 210 has discontinuities (depicted as periodic flat intervals 410) of constant magnitude between each cycle. In the depicted example, the RF pulses 220 are applied during these flat intervals 410 of constant magnitude occurring between sinusoidal-wave pulses at the gradient coils 30, 32, and 34. If the relative amplitudes of the phase-encoding waveforms on the Gy gradient 206 are arranged such that the center of k-space is traversed at a time TE after the RF excitation pulse (first pulse of 220 in FIG. 5), the degree of T2 contrast of sequence 400 can be tuned by adjusting TE. Alternatively, if a nonselective inversion pulse followed by a delay time TI is played out prior to the pulse sequence 400, then T1 contrast can be tuned by adjusting TI.

Figure 6:
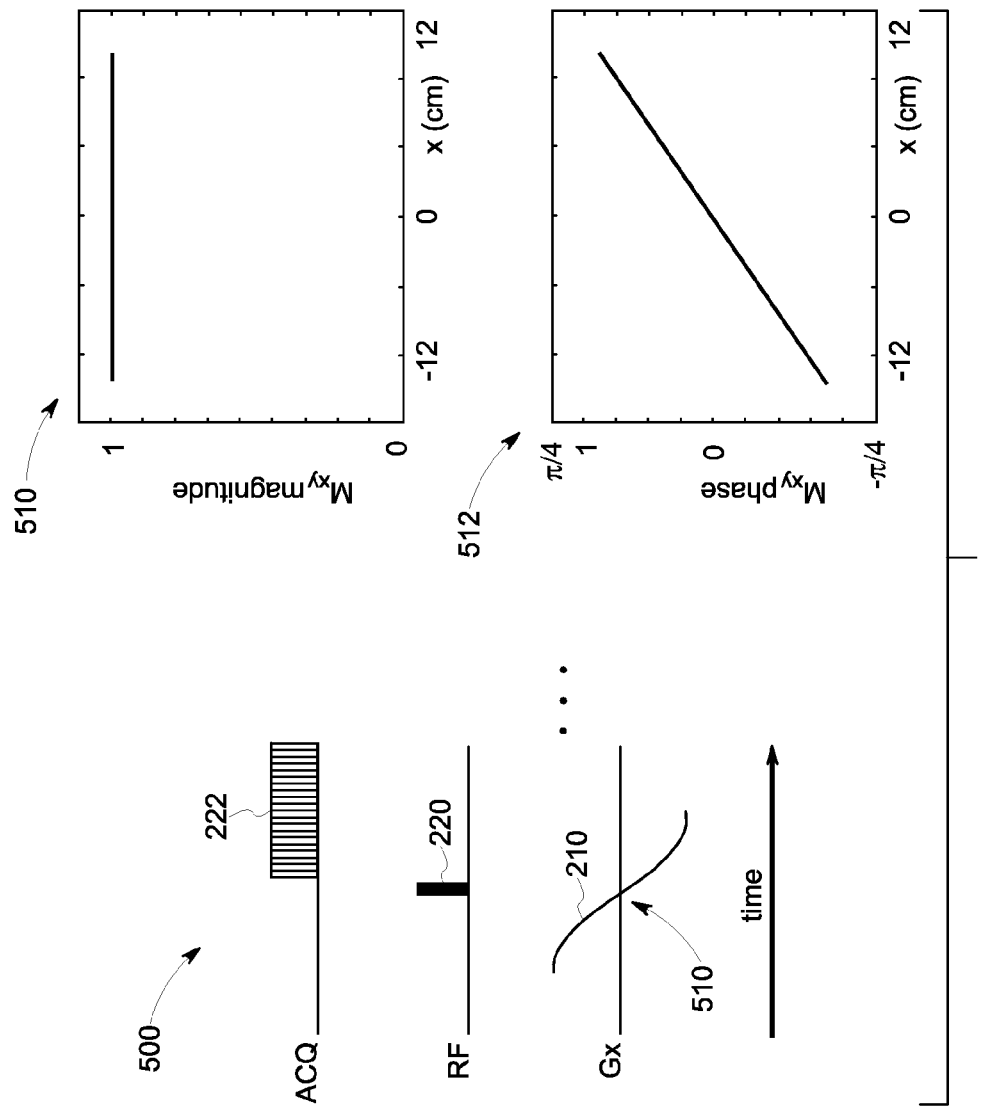
FIG. 6 depicts the effects of applying a square excitation pulse at a sinusoidal wave gradient zero-crossing, in accordance with an aspect of the present disclosure.

Turning to FIG. 6, a detail of a pulse sequence 500 from the quiet GRE pulse sequence 300 of FIG. 3 is depicted. In this detail, the effect of applying a square excitation pulse 220 at a gradient zero-crossing 510 (here the x-gradient zero crossing) is shown modeled using the Bloch Equations for the case tip=$\pi/2$, PW RF1=0.5 ms, Field of View (FOV)=24 cm, t-readout=8 ms, nsamp=256.

Because the gradient waveform 210 is changing in magnitude during the time interval when the RF pulse 210 is applied, a non-uniform MR excitation results. Under these circumstances the magnitude 510 of the exited magnetization is uniform across the readout field of view, but the phase 512 is varying. In particular, in the modeled example the magnitude of the transverse magnetization (graph 510) was 1 across the FOV, but with a net phase roll (graph 512) in the readout direction of slightly under $\pi/2$ across the FOV. In one implementation, this may be addressed by adjusting the phase in the reconstruction or by acquiring nex=2 with gradient ramps in opposite directions, in which case the phase roll will go to zero, but the magnitude may be affected slightly at the edges of the FOV.

Figure 7:
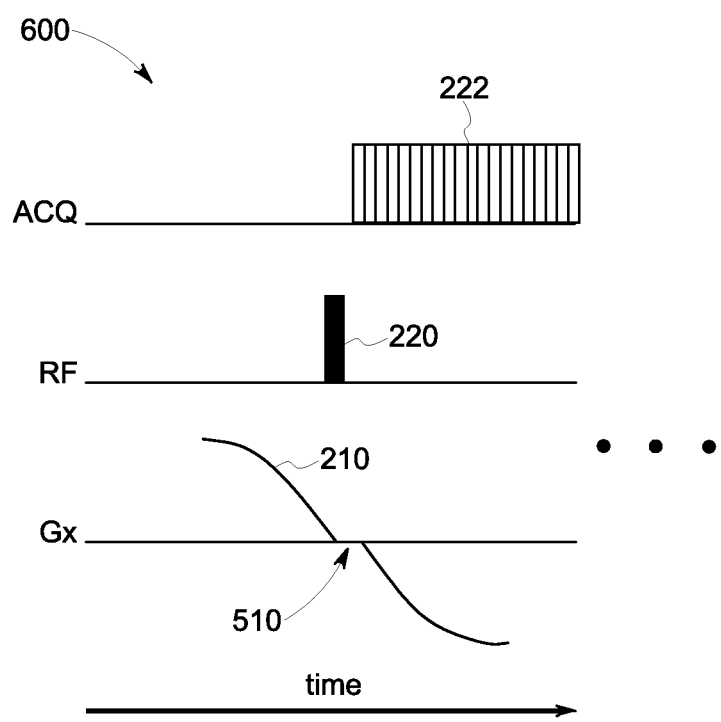
FIG. 7 depicts the application of a square excitation pulse at a discontinuous sinusoidal wave gradient zero-crossing, in accordance with an aspect of the present disclosure.

Alternatively, turning to FIG. 7, in an alternative embodiment of a quiet GRE pulse sequence 600, each lobe of the sinusoidal gradient waveform 210 is interleaved with a section 510 of zero gradient amplitude during application of each RF pulse 220. Thus, in this embodiment, the RF pulse 220 is not applied while the gradient waveform 220 is changing in magnitude.

Technical effects of the invention include use of sinusoidal gradient waveforms to drive gradient coils in an MRI system. Sinusoidal-wave gradient waveforms may be applied on all three gradient axes to produce a relatively pure acoustic tone. Use of sinusoidal-wave gradient waveforms with a suitable TR results in a fundamental frequency that is about 10 Hz to about 60 Hz, which is essentially inaudible.

In certain embodiments, gradient directions may be spiraled in three-dimensions to generate a radial pin-cushion k-space trajectory.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for driving gradient coils of a magnetic resonance imaging system, comprising:
   driving at least a first gradient coil associated with a first gradient direction using a first sinusoidal gradient waveform and a second gradient coil associated with a second gradient direction using a second sinusoidal gradient waveform;
   generating RF pulses at one or more crossover events when the first sinusoidal gradient waveform and the second sinusoidal gradient waveform cross their respective gradient zero lines;
   acquiring a respective readout signal after each RF pulse; and
   generating an image using the acquired readout signals.

2. The method of claim 1, further comprising:
   driving a third gradient coil with a third sinusoidal gradient waveform, wherein the RF pulses are also generated when the third sinusoidal gradient waveform crosses its respective gradient zero line.

3. The method of claim 1, wherein the first sinusoidal gradient waveform and the second sinusoidal gradient waveform are vertically offset such that the respective areas encompassed by positive portions and negative portions of the sinusoidal gradient waveforms are not equal.

4. The method of claim 3, wherein the respective area of positive portions of the sinusoidal gradient waveforms is about twice the respective area of the negative portions of the sinusoidal gradient waveforms.

5. The method of claim 1, wherein RF pulses are generated at each zero crossover event.

6. The method of claim 1, wherein RF pulses are generated at alternate crossover events.

7. The method of claim 1, wherein the gradient directions are spiraled in three-dimensions during an imaging sequence.

8. The method of claim 1, wherein readout signals are acquired immediately following each RF pulse.

9. The method of claim 1, wherein each readout signal is acquired during a second sinusoidal lobe following a respective RF pulse and first sinusoidal lobe.

10. The method of claim 1, wherein one or both of the first sinusoidal gradient waveform or the second sinusoidal gradient waveform are interleaved with flat gradient waveforms.

11. The method of claim 10, wherein the RF pulses are generated during the flat gradient waveforms interleaved with the sinusoidal gradient waveforms.

12. The method of claim 1, wherein the first gradient coil and the second gradient coil, when driven using the respective first sinusoidal gradient waveform and second sinusoidal gradient waveform, operate at between about 10 Hz to 60 Hz.

13. The method of claim 1, wherein the repetition time is greater than about 8 ms.

14. One or more tangible, non-transitory machine-readable media encoding processor-executable routines, wherein the routines, when executed by a processor cause acts to be performed comprising:
   driving at least a first gradient coil associated with a first gradient direction using a first sinusoidal gradient waveform and a second gradient coil associated with a second gradient direction using a second sinusoidal gradient waveform;
   generating RF pulses at one or more crossover events when the first sinusoidal gradient waveform and the second sinusoidal gradient waveform cross their respective gradient zero lines;
   acquiring a respective readout signal after each RF pulse; and
   generating an image using the acquired readout signals.

15. The one or more tangible, non-transitory machine-readable media of claim 14, wherein the first sinusoidal gradient waveform and the second sinusoidal gradient waveform are vertically offset such that the respective areas of positive portions and negative portions of the sinusoidal gradient waveforms are not equal.

16. The one or more tangible, non-transitory machine-readable media of claim 14, wherein the gradient directions are spiraled in three-dimensions during an imaging sequence.

17. The one or more tangible, non-transitory machine-readable media of claim 14, wherein one or both of the first sinusoidal gradient waveform or the second sinusoidal gradient waveform are interleaved with flat gradient waveforms.

18. A magnetic resonance imaging (MRI) system, comprising:
   a primary field magnet;
   a plurality of gradient field coils;
   a radiofrequency (RF) transmit coil;
   an array of receiving coils; and
   control circuitry coupled to the gradient field coils, to the RF transmit coil, and to the array of receiving coils, wherein the control circuitry is configured to:
      drive at least a first gradient coil associated with a first gradient direction using a first sinusoidal gradient waveform and a second gradient coil associated with a second gradient direction using a second sinusoidal gradient waveform;
      generate RF pulses at one or more crossover events when the first sinusoidal gradient waveform and the second sinusoidal gradient waveform cross their respective gradient zero lines;
      acquire a respective readout signal after each RF pulse; and
      generate an image using the acquired readout signals.

19. The MRI system of claim 18, wherein the first sinusoidal gradient waveform and the second sinusoidal gradient waveform are vertically offset such that the respective areas of positive portions and negative portions of the sinusoidal gradient waveforms are not equal.

20. The MRI system of claim 18, wherein the gradient directions are spiraled in three-dimensions during an imaging sequence.

21. The MRI system of claim 18, wherein one or both of the first sinusoidal gradient waveform or the second sinusoidal gradient waveform are interleaved with flat gradient waveforms.

* * * * *